United States Patent
Briggs et al.

(10) Patent No.: US 9,991,677 B2
(45) Date of Patent: Jun. 5, 2018

(54) INDEX-COUPLED DISTRIBUTED-FEEDBACK SEMICONDUCTOR QUANTUM CASCADE LASERS FABRICATED WITHOUT EPITAXIAL REGROWTH

(71) Applicant: California Institute of Technology, Pasadena, CA (US)

(72) Inventors: Ryan M. Briggs, Pasadena, CA (US); Clifford F. Frez, Arcadia, CA (US); Siamak Forouhar, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 118 days.

(21) Appl. No.: 14/711,695

(22) Filed: May 13, 2015

(65) Prior Publication Data
US 2015/0333482 A1    Nov. 19, 2015

Related U.S. Application Data

(60) Provisional application No. 61/992,667, filed on May 13, 2014.

(51) Int. Cl.
*H01S 5/34* (2006.01)
*H01S 5/125* (2006.01)
*H01S 5/22* (2006.01)
*H01S 5/12* (2006.01)
*H01S 5/227* (2006.01)

(52) U.S. Cl.
CPC ............ *H01S 5/3402* (2013.01); *H01S 5/125* (2013.01); *H01S 5/1237* (2013.01); *H01S 5/22* (2013.01); *H01S 5/12* (2013.01); *H01S 5/2216* (2013.01); *H01S 5/2275* (2013.01)

(58) Field of Classification Search
CPC ...... H01S 5/3402; H01S 5/1237; H01S 5/125; H01S 5/22; H01S 5/2216; H01S 5/2275; H01S 5/12
See application file for complete search history.

(56) References Cited

U.S. PATENT DOCUMENTS

| | | | |
|---|---|---|---|
| 5,953,356 A | 9/1999 | Botez et al. | |
| 6,204,078 B1* | 3/2001 | Inomoto | H01S 5/12 438/22 |
| 6,326,646 B1 | 12/2001 | Baillargeon et al. | |
| 7,408,966 B2 | 8/2008 | Botez et al. | |
| 9,438,011 B2 | 9/2016 | Frez et al. | |

(Continued)

OTHER PUBLICATIONS

M. Wienold et al., "Lateral distributed-feedback gratings for single-mode, high-power terahertz quantum-cascade lasers," Opt. Express 20, 11207-11217 (2012).*

(Continued)

*Primary Examiner* — Xinning Niu
(74) *Attorney, Agent, or Firm* — KPPB LLP

(57) ABSTRACT

Quantum cascade (QC) lasers and methods of fabricating such QC lasers are provided. The QC lasers incorporate a DFB grating without requiring the use of relying on epitaxial regrowth processes. The DFB gratings are formed as sidewall gratings along the lateral length of the QC active region, or the DFB gratings are formed atop the lateral length of the QC active region, and wherein the top DFB grating is planarized with a polymeric material.

11 Claims, 15 Drawing Sheets

(56) References Cited

U.S. PATENT DOCUMENTS

| | | | |
|---|---|---|---|
| 2007/0248134 A1* | 10/2007 | Hatori | B82Y 20/00 372/45.01 |
| 2013/0221223 A1 | 8/2013 | Caneau et al. | |
| 2013/0287054 A1* | 10/2013 | Kwon | H01S 5/1225 372/45.01 |
| 2014/0355637 A1 | 12/2014 | Hashimoto et al. | |
| 2016/0049770 A1 | 2/2016 | Frez et al. | |

OTHER PUBLICATIONS

Golka et al., "Quantum cascade lasers with lateral double-sided distributed feedback grating", Applied Physics Letters, vol. 86, Mar. 7, 2005, 111103.*

Briggs et al., "Single-mode 2.65 urn InGaAsSb/AlInGaAsSb laterally coupled distributed-feedback diode lasers for atmospheric gas detection", Opt. Express, 21, 2013, pp. 1317-1323.

Evans et al., "Buried heterostructure quantum cascade lasers with high continuous-wave wall plug efficiency", Applied Physics Letters, 2007, vol. 91, pp. 071101-1-071101-3.

Faist et al., "Distributed feedback quantum cascade lasers", Appl. Phys. Lett., May 19, 1997, 70(20), pp. 2670-2672.

Gmachl et al., "Continuous-wave and high-power pulsed operation of index-coupled distributed feedback quantum cascade laser at $\lambda \approx 8.5$ μm", Applied Physics Letters, Mar. 23, 1998, vol. 72, No. 1, pp. 1430-1432.

Hinkov et al., "Singlemode quantum cascade lasers with power dissipation below 1 W", Electronics Letters, May 24, 2012, vol. 48, No. 11, 2 pgs.

Kosterev et al., "Application of quantum cascade lasers to trace gas analysis", Appl. Phys., 2008, B90, pp. 165-176.

Lu et al, "Room-temperature continuous wave operation of distributed feedback quantum cascade lasers with watt-level power output", Applied Physics Letters, 2010, vol. 97, pp. 231119-1-231119-3.

Streifer et al., "Effect of External Reflectors on Longitudinal Modes of Distributed Feedback Lasers", IEEE Journal of Quantum Electronics, Apr. 1975, pp. 154-161.

Streifer et al., "TM-Mode Coupling Coefficients in Guided-Wave Distributed Feedback Lasers", IEEE Journal of Quantum Electronics, Feb. 1976, vol. QE-12, No. 2, pp. 74-78.

Canedy et al., "High-power, narrow-ridge, mid-infrared interband cascade lasers", Journal of Crystal Growth, Jan. 9, 2007, vol. 301-302, pp. 931-934.

Canedy et al., "High-power, narrow-ridge, mid-infrared interband cascade lasers", Journal of Vacuum Science & Technology, May/Jun. 2008, B26, pp. 1160-1162.

Choi et al., "Evaluation of coupling Coefficients for Laterally-Coupled Distributed Feedback Lasers", Jpn. J. Appl. Phys., Sep. 1996, vol. 35, pp. 4654-4659.

Forouhar et al., "High-power laterally coupled distributed-feedback GaSb- based diode lasers at 2um wavelength", Applied Physics Letters, Jan. 19, 2012, vol. 100, pp. 031107-1-031107-4.

Forouhar et al., "Reliable mid-infrared laterally-coupled distributed-feedback interband cascade layers", Applied Physics Letter, Aug. 4, 2014, vol. 105, 4 pgs.

Gupta et al., "Modal Gain of 2.4-um InGaAsSb—AlGaAsSb Complex-Coupled Distributed-Feedback Lasers", IEEE Photonics Technology Letters, Oct. 15, 2009, vol. 21, No. 20, pp. 1532-1534.

Gupta et al., "Single mode 2.4 um InGaAsSb/AlGaAsSb distributed feedback lasers for gas sensing", Applied Physics Letter, Jul. 27, 2009, vol. 95, pp. 041104-1-041104-3.

Keil et al., "Oxide dual Damascene Trench Etch Profile Control", Journal of the Electrochemical Society, Jun. 5, 2001, vol. 148, No. 7, pp. G383-G388.

Kim et al., "Corrugated-sidewall interband cascade lasers with single-mode midwave-infrared emission at room temperature", Applied Physics Letters, Dec. 8, 2009, vol. 95, pp. 231103-1-231103-4.

Kim et al., "Mid-infrared distributed-feedback interband cascade lasers with continuous-wave single-mode emission to 80 degrees C", Applied Physics Letter, Aug. 6, 2012, vol. 101, pp. 061104-1-061104-3.

Lehnhardt et al., "Continuous wave single mode operation of GaInAsSb/GaSb quantum well lasers emitting beyond 3 urn", Applied Physics Letters, May 8, 2008, vol. 92, pp. 183508-1-183508-3.

Salhi et al., "Single-frequency Sb-based distributed-feedback lasers emitting at 2.3 um above room temperature for application in tunable diode laser absorption spectroscopy", Applied Optics, Jul. 10, 2006, vol. 45, No. 20, pp. 4957-4965.

Streifer et al., "Coupling Coefficients for Distributed Feedback Single- and Double-Heterostructure Diode Lasers", IEEE Journal of Quantum Electronics, Nov. 1975, vol. QE-11, No. 11, pp. 867-873.

Vurgaftman et al, "Rebalancing of internally generated carriers for mid-infrared interband cascade lasers with very low power consumption", Nature Communications, Dec. 13, 2011, 7 pgs.

* cited by examiner

Prior Art

INDEX-COUPLED DISTRIBUTED-FEEDBACK SEMICONDUCTOR QUANTUM CASCADE LASERS FABRICATED WITHOUT EPITAXIAL REGROWTH

CROSS-REFERENCE TO RELATED APPLICATIONS

The present application claims priority to U.S. Provisional Patent Application No. 61/992,667, filed May 13, 2014, the disclosure of which is incorporated herein by reference.

FEDERAL SUPPORT STATEMENT

The invention described herein was made in the performance of work under a NASA contract, and is subject to the provisions of Public Law 96-517 (35 USC 202) in which the Contractor has elected to retain title.

FIELD OF THE INVENTION

The present disclosure is directed to quantum cascade lasers and methods of manufacturing such lasers; and more particularly to quantum cascade lasers fabricated using methods without epitaxial regrowth.

BACKGROUND

Laser absorption spectroscopy has emerged as one of the most important applications for semiconductor quantum cascade (QC) lasers, particularly in the mid-infrared spectral regime where many gases of interest exhibit strong absorption features. Single-mode laser sources can selectively target absorption lines of key atmospheric gases and their less abundant isotopologues in order to study the structure and evolution of Earth and even other solar system bodies. For environmental safety and monitoring, laser-based sensors have the potential to match or exceed the sensitivity of electrochemical sensors presently used in many applications, and laser-based detectors are capable of long-duration maintenance-free operation without consumable components.

To realize an effective laser-based absorption spectroscopy instrument, the laser source should produce stable single-mode emission with enough tunability to span at least one target gas absorption line. This has prompted the development of several schemes for suppressing multimode operation, the most compact and mechanically robust of which employs an integrated distributed-feedback (DFB) grating. Over the past several years, DFB QC lasers have been demonstrated using both loss-coupled metallic gratings and index-coupled semiconductor structures. For low power operation, which is particularly important for portable gas detection instruments, buried heterostructure devices with etched index-coupled gratings have been the most successful; however, fabrication of buried gratings relies on epitaxial regrowth, which adds significant processing complexity and capital equipment costs.

BRIEF SUMMARY

The present disclosure provides embodiments directed to quantum cascade lasers and methods of manufacturing such lasers such that the use of epitaxial regrowth in forming the distributed-feedback grating integrated therewith is not required.

Many embodiments are directed to quantum cascade lasers including:
- an elongated waveguide ridge having characteristic width and length dimensions and being formed of a plurality of epitaxial layers, the longitudinal dimension of the waveguide ridge defining a laser cavity comprising an active region of semiconductor quantum well structures configured to employ intersubband electronic transitions;
- at least one conductive epitaxial cladding layer disposed atop and below the active region of the waveguide ridge;
- a distributed feedback grating comprising a plurality of periodic vertical corrugations formed into both lateral edges of the waveguide ridge along the longitudinal length of said waveguide ridge, the corrugations having characteristic modulation depth and pitch;
- a dielectric layer conformally disposed atop the distributed feedback grating; and
- a conductive contact layer disposed atop the dielectric layer and elongated waveguide ridge;
- wherein the corrugations are disposed through at least the top cladding layer and each of the epitaxial layers of the waveguide ridge; and
- wherein the width of the waveguide ridge and the modulation depth and pitch of the corrugations are configured such that the corrugations have a coupling coefficient sufficient to interact with the active region of the laser to impose single-mode emission at specific engineered wavelengths thereon.

In some other embodiments the corrugations have an open profile having a modulation depth, d, that is equal to or less than the pitch, $\Lambda$, of the periodic vertical corrugations such that the aspect ratio of the corrugations, $d/\Lambda$ is less than 1.

In still other embodiments the corrugations are configured such that no tangent of the corrugation surface is perpendicular to the longitudinal axis of the waveguide ridge.

In yet other embodiments the dielectric layer is formed of a material at a thickness sufficient to isolate the optical mode guided by the laser waveguide from the conductive contact later, wherein the dielectric material is transparent at the laser emission wavelength, and wherein the dielectric material has a lower refractive index than the effective index of the laser active region thereby confining light to the laser ridge.

In still yet other embodiments the dielectric layer is configured to allow for the conduction of thermal energy from the active region into the contact layer.

In still yet other embodiments at least one of the top and bottom cladding layers are formed from InP, wherein the epitaxial layers of the waveguide ridge are formed from a combination of InGaAs and AlInAs, wherein the dielectric layer is formed of a $SiN_x$ material having a thickness of less than 1 µm, and wherein the conductive contact layer is formed from metal having a thickness of at least 2 µm.

Many other embodiments are directed to methods of forming a quantum cascade layer including:
- epitaxially growing a plurality of semiconductor layers atop a bottom cladding layer to form an elongated waveguide ridge having characteristic width and length dimensions, the longitudinal dimension of the waveguide ridge defining a laser cavity comprising an active region of semiconductor quantum well structures configured to employ intersubband electronic transitions;
- epitaxially growing a further cladding layer atop the waveguide ridge;

lithographically patterning a distributed feedback grating comprising a plurality of vertical corrugations into both lateral edges of the waveguide ridge along the longitudinal length of said waveguide ridge, the corrugations having characteristic modulation depth and profile;

vertical plasma etching the patterned plurality of vertical corrugations into the waveguide ridge through at least the top cladding layer and each of the epitaxial layers of the waveguide ridge;

vapor depositing a dielectric layer conformally atop the distributed feedback grating; and electrodepositing a conductive contact layer atop the dielectric layer and elongated waveguide ridge;

wherein the corrugations are disposed through at least the top cladding layer and each of the epitaxial layers of the waveguide ridge; and wherein the width of the waveguide ridge and the modulation depth and profile of the corrugations are configured such that the corrugations have a coupling coefficient sufficient to interact with the active region of the laser to impose single-mode operation and emission at specific engineered wavelengths thereon.

In some other embodiments the methods further include wet etching the corrugations such that the geometric conformation of the corrugations are not altered.

In still other embodiments the plasma etching utilizes an anisotropic non-selective plasma etching process.

In yet other embodiments the corrugations have an open profile having a modulation depth, d, that is equal to or less than the pitch, $\Lambda$, of the periodic vertical corrugations such that the aspect ratio of the corrugations, $d/\Lambda$ is less than 1.

In still yet other embodiments the corrugations are configured such that no tangent of the corrugation surface is perpendicular to the longitudinal axis of the waveguide ridge.

In still yet other embodiments the dielectric layer is formed of a material at a thickness sufficient to isolate the optical mode guided by the laser waveguides from the contact later, and to allow for the conduction of thermal energy from the active region into the contact layer, wherein the dielectric material is transparent at the laser emission wavelength, and wherein the dielectric material has a lower refractive index than the effective index of the laser active region thereby confining light to the laser ridge.

Still many other embodiments are directed to a quantum cascade laser including:
an elongated waveguide ridge having characteristic width and length dimensions and being formed of a plurality of epitaxial layers, the longitudinal dimension of the waveguide ridge defining a laser cavity comprising an active region of semiconductor quantum well structures configured to employ intersubband electronic transitions;

at least one cladding layer disposed atop and below the active region of the waveguide ridge;

a distributed feedback grating comprising a plurality of corrugations formed into the top cladding layer across a portion of the width of the waveguide ridge along the longitudinal length of said waveguide ridge, the corrugations having characteristic modulation depth and profile;

a polymeric planarization infill layer disposed atop the distribute feedback grating to form a smooth top surface;

a dielectric layer disposed atop the distributed feedback grating; and a conductive contact layer disposed atop the dielectric layer and elongated waveguide ridge; and wherein the modulation depth and profile of the corrugations are configured such that the corrugations have a coupling coefficient sufficient to interact with the active region of the laser to impose single-mode operation and emission at specific engineered wavelengths thereon.

In some other embodiments the dielectric layer is formed of a material at a thickness sufficient to isolate the optical mode guided by the laser waveguides from the contact later.

In still other embodiments the dielectric layer is formed to allow for the conduction of thermal energy from the active region into the contact layer.

In yet other embodiments the polymeric planarization infill layer comprises a high refractive-index contrast polymer.

In still yet other embodiments at least one of the top and bottom cladding layers are formed from InP, wherein the epitaxial layers of the waveguide ridge are formed from a combination of InGaAs and AlInAs, wherein the dielectric layer is formed of a $SiN_x$ material having a thickness of from 4 to 5 µm, wherein the polymeric planarization infill layer is formed of a polyimide, and wherein the conductive contact layer is formed from metal having a thickness of at least 5 µm.

Yet many other embodiments are directed to methods of forming a quantum cascade layer including:
epitaxially growing a plurality of semiconductor layers atop a bottom cladding layer to form an elongated waveguide ridge having characteristic width and length dimensions, the longitudinal dimension of the waveguide ridge defining a laser cavity comprising an active region of semiconductor quantum well structures configured to employ intersubband electronic transitions;

epitaxially growing a further cladding layer atop the waveguide ridge;

lithographically patterning a distributed feedback grating comprising a plurality of corrugations formed into the top cladding layer across a portion of the width of the waveguide ridge along the longitudinal length of said waveguide ridge, the corrugations having characteristic modulation depth and profile;

plasma etching the patterned plurality of corrugations into the waveguide ridge through at least the top cladding layer of the waveguide ridge;

planarizing the distributed feedback grating by infilling the corrugations with a polymeric material;

vapor depositing a dielectric layer atop the distributed feedback grating;

electrodepositing a conductive contact layer atop the dielectric layer and elongated waveguide ridge; and wherein the modulation depth and profile of the corrugations are configured such that the corrugations have a coupling coefficient sufficient to interact with the active region of the laser to impose single-mode operation and emission at specific engineered wavelengths thereon.

In some other embodiments the method further includes wet etching the corrugations such that the geometric conformation of the corrugations are not altered.

In still other embodiments the plasma etching utilizes an anisotropic non-selective plasma etching process.

In yet other embodiments the planarizing includes infilling the distributed feedback grating with a spin-on polymer followed by etching the polymer back to the top edge of the corrugations of the distributed feedback grating.

In still yet other embodiments the dielectric layer is formed of a material at a thickness sufficient to isolate the optical mode guided by the laser waveguides from the contact later, and to allow for the conduction of thermal energy from the active region into the contact layer.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

In accordance with the provided disclosure and drawings, quantum cascade (QC) lasers and methods of fabricating such QC lasers are provided. In many such embodiments the QC lasers incorporate a DFB grating without requiring the use of relying on epitaxial regrowth processes. In some such embodiments the DFB gratings are formed as sidewall gratings along the lateral length of the QC active region. In other such embodiments the DFB gratings are formed atop the lateral length of the QC active region, and wherein the top DFB grating is planarized with a polymeric material.

Quantum cascade (QC) lasers employ intersubband electronic transitions in semiconductor quantum well structures to generate emission at specific engineered wavelengths. QC devices have been particularly successful as mid-infrared emitters in the 4 to 12 µm range, a wavelength regime that is difficult to access with interband diode lasers. As cascade devices, QC lasers can also be designed with many gain stages, which, combined with optimized doping and optical design, has enabled the development of lasers with remarkably high continuous output power (in excess of 1 W). One of the most important applications of mid-infrared QC lasers is quantitative gas detection using absorption spectroscopy, where a single-frequency laser is used to interrogate specific absorption lines of a target compound. While high output power is essential in certain applications, many in situ absorption spectrometers require only milliwatt-level output to effectively measure low levels of compounds of interest with strong absorption lines in the mid-infrared regime.

For portable laser-based instruments—including absorption spectrometers on mobile platforms—the power consumption of the laser source can often be the limiting factor in reducing size and overall power requirements. Commercially available single-mode QC lasers in the 4 to 12 µm range typically emit much more than 10 mW, but consume several watts of power and, due to continuous wall-plug efficiencies below 10%, much of this power is converted to heat and must be dissipated with an active cooler to maintain continuous operation near room temperature. The problem addressed here is one of power scaling: In portable spectrometer applications where less than 10 mW is required, it is nontrivial to design a QC laser with proportionally less input power, while maintain continuous-wave (CW) laser emission near room-temperature.

Figure 1:
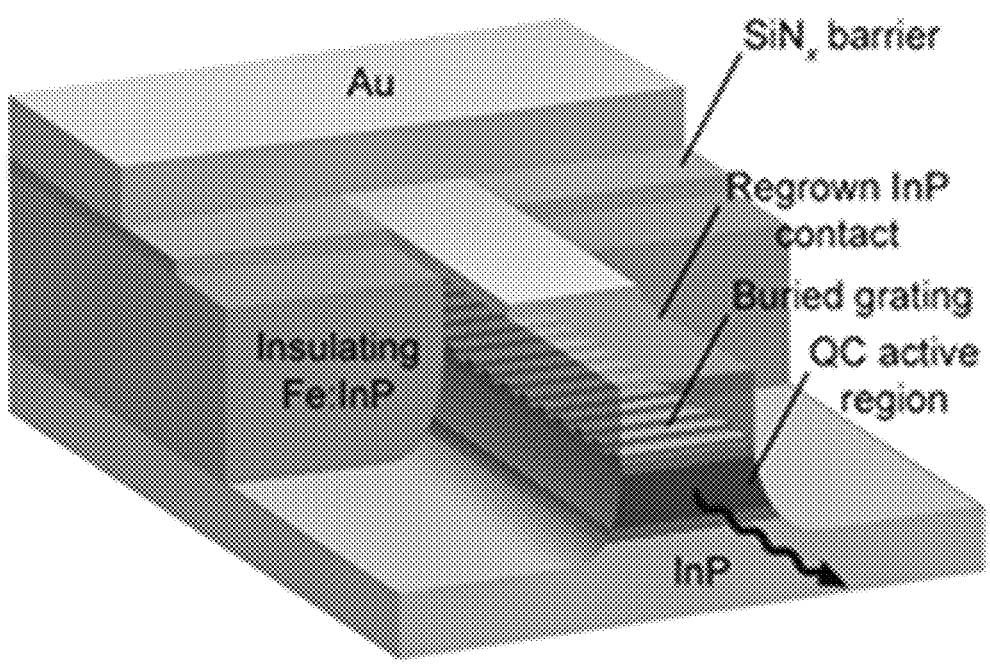
FIG. 1 provides a schematic of a conventional buried-heterostructure single-mode QC laser fabricated with two regrowth processes.

There has been one recent demonstration of a single-mode QC laser with watt-level power consumption and CW emission at room temperature (Hinkov, et al., *Electronics Letters*, Vol. 48, No. 11, pp. 646-647 (2012), the disclosure of which is incorporated herein by reference). This result relies on a QC laser structure (FIG. 1) formed using three epitaxial semiconductor growth steps: Initial growth of the active InGaAs/AlInAs quantum wells on an InP substrate, epitaxial regrowth of an InP top cladding layer following fabrication of a wavelength-selective distributed feedback (DFB) grating on top of the quantum wells, and regrowth of semi-insulating Fe-doped InP on the sidewalls of the laser to provide an electrical and optical confinement as well as relatively efficient heat extraction. The last two regrowth steps are performed after processing outside of the initial growth chamber, and therefore require stringent controls to maintain atomically clean surfaces. Furthermore, Fe:InP growth typically requires a dedicated growth chamber to avoid contamination of conductive InP cladding layers. With epitaxial growth representing the most infrastructure-intensive aspect of semiconductor laser fabrication, eliminating these regrowth steps can significantly reduce fabrication cost while improving manufacturability and throughput.

Embodiments Incorporating Sidewall Grating Structures

Many embodiments are directed to producing single-mode QC lasers suitable for in situ spectroscopy instruments with power consumption below 1 W, including power required for temperature stabilization. In particular, optoelectronic designs and fabrication processes according to embodiments are presented that reduce QC laser power consumption for devices emitting in the 4 to 5 µm wavelength range. Such embodiments yield single-mode lasers with stable, tunable emission and low input power (approximately 1 W) for CW operation from room temperature to at least 50° C. The combination of low power dissipation and room-temperature functionality enables operation of complete laser modules (including integrated thermoelectric coolers) with watt-level input. Furthermore, embodiments of process are provided that allow for the manufacture of these lasers using only one epitaxial growth process to create the active quantum wells and cladding layers. In such embodiments, the DFB grating and optical and electrical isolation structures are formed without semiconductor regrowth.

Figure 2A:
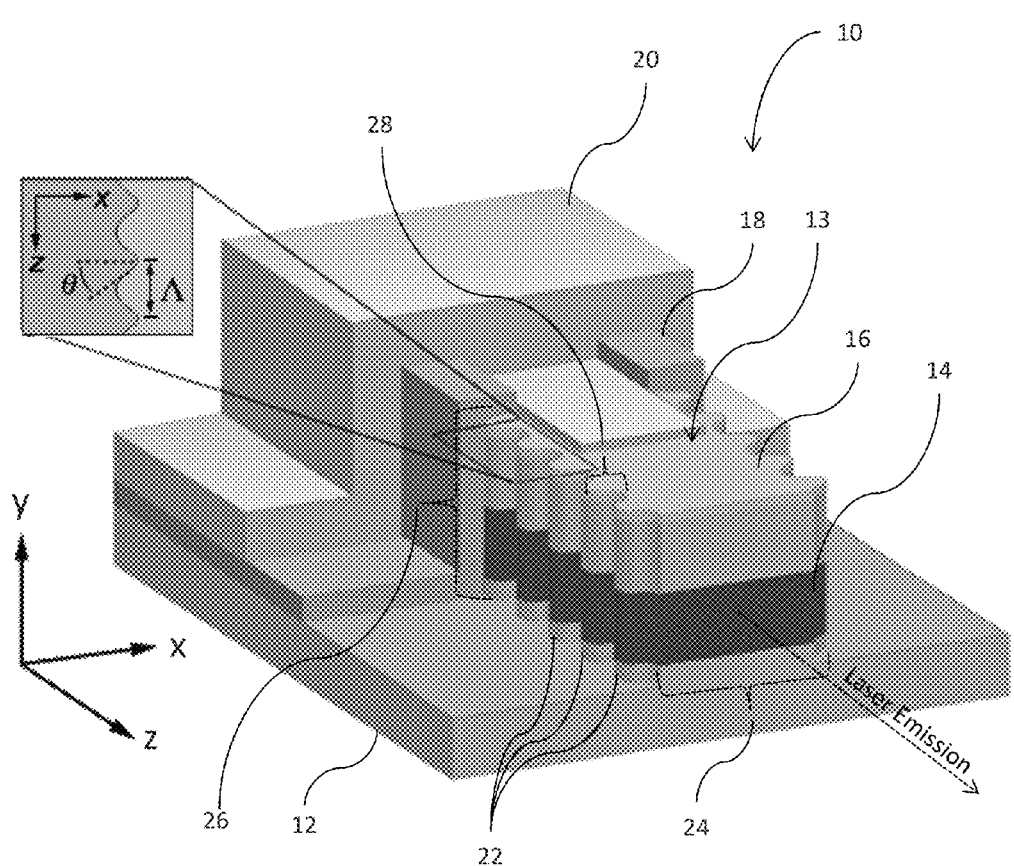
FIG. 2a provides a schematic of a regrowth-free sidewall-grating QC laser structure in accordance with embodiments of the invention.

As shown schematically in FIG. 2a, in many embodiments the sidewall-grating QC lasers (10) comprise a multilayer structure formed atop a suitable cladding substrate (12). In an exemplary embodiment the substrate is formed from an InP layer, however any suitable substrate material may be used, including GaAs and GaSb. A waveguide ridge (13) having an active region (14) composed of quantum well structures is fabricated from epitaxial layers disposed atop the substrate. In one exemplary embodiment the active region was formed with a two-phonon extraction structure from InGaAs/AlInAs epitaxial lasers, although other alloys matched to InP, GaAs, or GaSb may be selected, and the unique aspects of the lasers could be applied to other optimized active region designs at various wavelengths based on the desired laser performance.

Atop the active region (14) a cladding layer (16), such as, for example, formed from an InP or other equivalently suitable epitaxial material is disposed. Above this structure a dielectric barrier (18) and conductive contact (20) are disposed to complete the structure. With respect to the dielectric barrier and contact layers it will be understood that any suitable materials, such as may be known in the prior art may be used to form these structures. For example, in many embodiments the dielectric layer may be made from aluminum nitride (AlN) or silicon nitride ($SiN_x$). In some embodiments the dielectric layer has a thickness of less than 1 µm. Likewise, the conductive contacts may be made from any suitable conductive material, such as, for example, a conductive metal such as Au, Ag, Pt, Pd, Cu, etc. Preferably the contact layer is sufficiently thick to serve as a heat sink to the laser. In some such embodiments a contact layer comprising a conductive metal of at least 5 µm is used.

Turning to the construction of the waveguide ridge (13) of the QC lasers, in accordance with many embodiments the ridge is formed with a uniformly narrow ridge width (24) through the entire laser active region (14). Although suitable ridge widths may vary, in many embodiments the width of the waveguide ridge is constrained such that the ridge supports only one lateral optical mode of a polarization matched to the polarization of light emitted in the active region. In many embodiments a waveguide ridge width narrower than the free-space wavelength of the laser emission may be used. In some embodiments a waveguide ridge width of around 4 µm may be used. Constraining the width of the waveguide ridge in accordance with embodiments allows for a relatively small absolute current to be sourced through the laser while achieving the relatively large current densities required to reach laser threshold, which ultimately reduces both power consumption and heat generation.

In many embodiments a vertical sidewall grating configuration is created where the lateral boundaries of the waveguide ridge (13) are vertically corrugated to form a first-order distributed-feedback side-wall grating (22) that imposes single-mode laser operation on the laser. The profile of the sidewall grating will depend on the interaction strength required to impose single-mode operation on the active region of the laser. In many embodiments, the sidewall grating is disposed through the full vertical height (26) of the waveguide ridge (13). The modulation depth (i.e., the lateral depth (28) that the grating corrugation cuts into the sidewall of the waveguide ridge), and tooth profile (i.e., shape and period) of the corrugation of the grating can be precisely patterned to provide optimal grating interaction strength for a given ridge width and cavity length (i.e., longitudinal length of the waveguide ridge). In some embodiments, a sidewall grating may be designed having a modulation depth, d, that is equal to or less than the pitch, $\Lambda$, of the periodic corrugations (i.e. the aspect ratio, $d/\Lambda$ is less than 1). Likewise, in some embodiments the tooth profile of the sidewall grating may be provided with a sinusoidal corrugation or other open shape, where an open profile is defined such that no tangent of the corrugated surface is perpendicular to the long axis of the laser ridge (i.e. $\theta > 0$ for all corrugation surfaces). Although gratings having alternative tooth profiles with sharper corners, such as rectangles or triangles, or larger modulation depths, it has been discovered that such structures are prone to manufacturing defects, such as mask erosion at the sharp corners that can result in non-uniform vertical etch profiles that results in unpredictable final ridge geometries. Furthermore, the open profile defined above enables uniform deposition of dielectric material into the corrugations by conventional non-epitaxial techniques (including plasma-enhanced chemical vapor deposition and physical vapor deposition) without introducing voids or other non-uniformities that can induce optical loss through scattering. In many embodiments, a suitable design of sidewall grating (e.g., modulation depth and tooth profile) may be selected by determining the optical mode profile of the active region and a suitable coupling coefficient, κ. In some such embodiments the coupling coefficient may be calculated using a suitable coupled-mode theory approximation, such as is described, for example, in W. Streifer, et al., *IEEE J. Quantum Electron.* 11, 867-873 (1975), the disclosure of which is incorporated herein by reference. (An exemplary embodiment of such a calculation is provided below with reference to FIGS. 4a and 4b.) Overall, by forming a waveguide ridge with DFB sidewall gratings in accordance with these embodiments, a laser having low power consumption and minimal heat generation may be obtained.

In many embodiments, the dielectric cladding layer is formed of a material at a thickness sufficient to isolate the optical mode guided by the laser waveguides from metallic electrical contacts, while being simultaneously thin enough to allow for some thermal extraction through the cladding to the conductive contact layer. In many embodiments, the dielectric cladding layer is transparent at the laser emission wavelength and has a lower refractive index than the composite index of the laser active region so that it confines light to the laser ridge. In some embodiments the dielectric cladding layer is formed of AlN or $SiN_x$ material having a thickness of less than 1 μm, and typically 0.5 μm.

Embodiments are also directed to methods of forming QC lasers having side-wall gratings in a single plasma-etching step. Such QC laser fabrication processes are greatly simplified compared with the two regrowth steps previously required to obtain buried heterostructure lasers with similar performance.

Figure 2B:
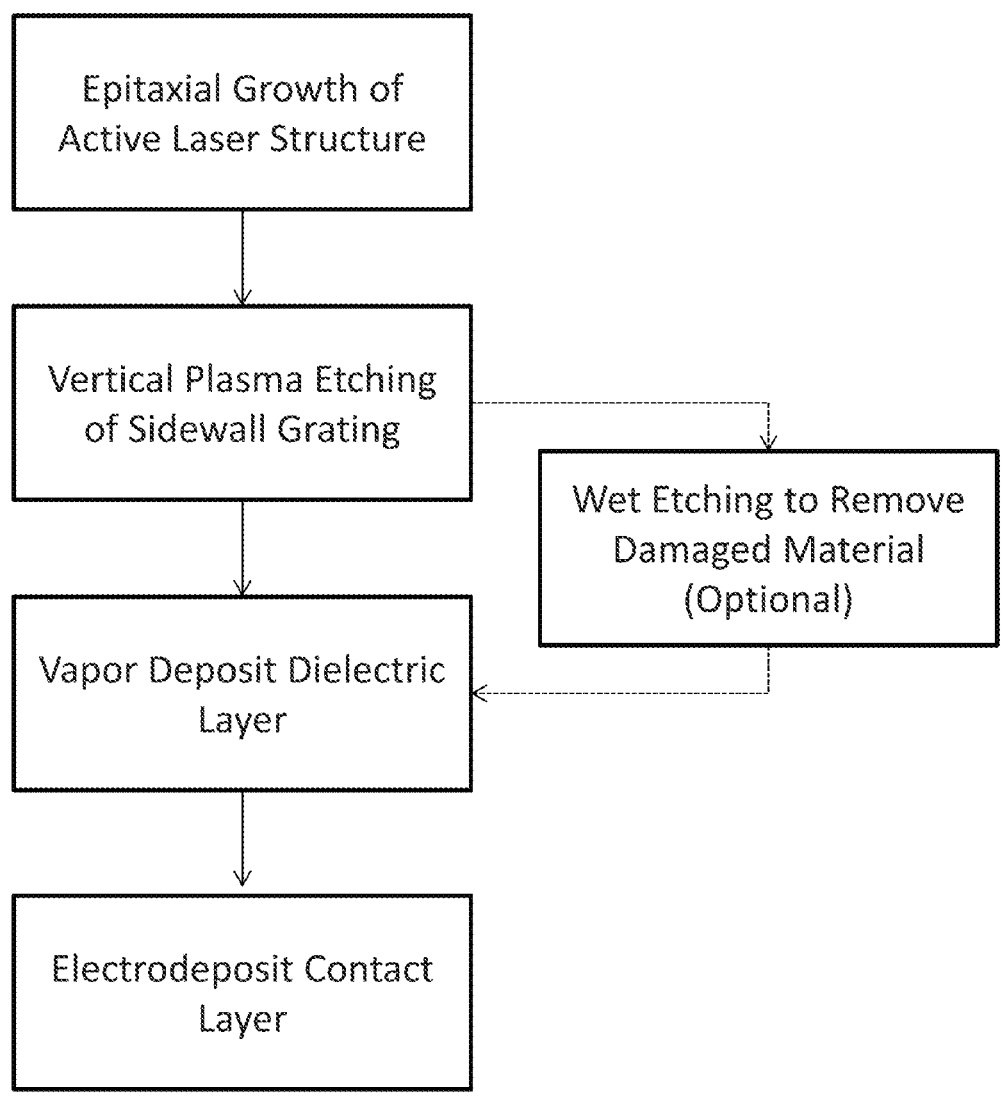
FIG. 2b provides a flow-chart for a process of forming a QC laser structure in accordance with embodiments of the invention.

In many embodiments a process for forming a QC laser is provided in a flow chart in FIG. 2b. Initially the waveguide ridge, including the active region and cladding are deposited on a suitable substrate via epitaxial growth. It should be understood with respect to the formation of the epitaxial layers that any suitable technique may be used such as, for example, molecular beam epitaxy, which provides precise thickness control, sharp layer interfaces, and controlled doping, or alternative processes, such as, for example, metal-organic chemical vapor deposition.

Once the epitaxial layers of the waveguide ridge and active region are disposed atop the substrate surface, an anisotropic non-selective plasma etching process is used to etch the pattern of the sidewall grating through each of the layers of the waveguide ridge, including, for example, the top cladding and the light-emitting quantum-well active region. As opposed to the isotropic wet chemical processes typically used to fabricate waveguide ridges for QC lasers, the vertical plasma etching process allows for precise patterning of small features on the top surface of the wafer using standard lithography processes, and then for high-fidelity transfer of those features completely through the epitaxial waveguide ridge laser structure. Optionally, the plasma etching process may be followed by a brief wet etch to remove debris and damaged material from the etched surface, however, the wet etch process should be controlled such that the device geometry is not substantially modified.

For electrical isolation of the etched laser ridges, a dielectric layer (such as, for example, aluminum nitride (AlN) or silicon nitride ($SiN_x$)) is deposited atop the grating using plasma-enhanced chemical vapor deposition or another non-epitaxial deposition process. Preferably the dielectric layers are transparent at the laser emission wavelength and are made sufficiently thick to isolate the optical mode guided by the laser waveguides from the top electrical contacts, but simultaneously thin enough to allow for lateral thermal extraction. Finally, a thick (2 to 10 μm, and typically 5 μm) electroplated contact layer (such as of Au) is deposited atop the dielectric layer to further help dissipate heat generated in the QC active region.

In one exemplary embodiment, a QC laser structure designed for emission near 4.8 μm was grown in a single process by molecular beam epitaxy on an n-InP substrate with a Si doping concentration of $10^{18}$ $cm^{-3}$. The 30-stage active region was composed of strain-balanced $Al_{0.638}In_{0.362}As/In_{0.669}Ga_{0.331}As$ layers based on a double-phonon resonance design (such as is described in A. Evans, et al., *Appl. Phys. Lett.* 91, 071101 (2007), the disclosure of which is incorporated by reference), and the injector layers were doped with Si to a concentration of $7\times10^{16}$ $cm^{-3}$. The active region was surrounded above and below by 2-μm-thick n-InP cladding layers with a Si doping concentration of $2\times10^{16}$ $cm^{-3}$, resulting in relatively low free-carrier absorption. The structure was capped with an n+-InP confinement layer and lattice-matched n+-InGaAs contact, both with a Si doping concentration of $10^{19}$ $cm^{-3}$.

Figure 3A:
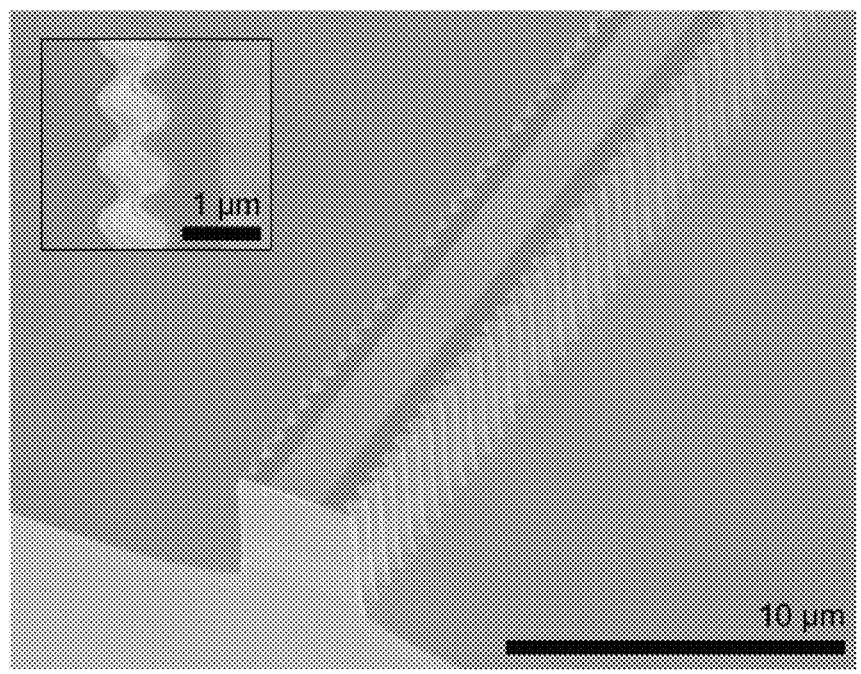
FIGS. 3a to 3c provide scanning electron micrographs of a sidewall-grating DFB laser: a) after the ridge etching process, b) after fabrication of the $SiN_x$ dielectric barrier and electroplated Au top contact, and c) of a cross section of a completed device with a 500-nm-thick $SiN_x$ barrier layer and an electroplated Au top contact in accordance with embodiments of the invention.

After depositing narrow Ti/Pt/Au contact stripes, waveguide ridges with first-order DFB lateral corrugations were patterned by electron-beam lithography and transferred into a SiNx hard mask deposited on top of the QC structure using a $SF_6/C_4F_8$ inductively coupled plasma (ICP) etch process. The ridge pattern was then etched into the semiconductor structure using an anisotropic, nonselective $Cl_2/H_2/CH_4$ ICP etching process, as shown in FIG. 3a.

Figure 3B:
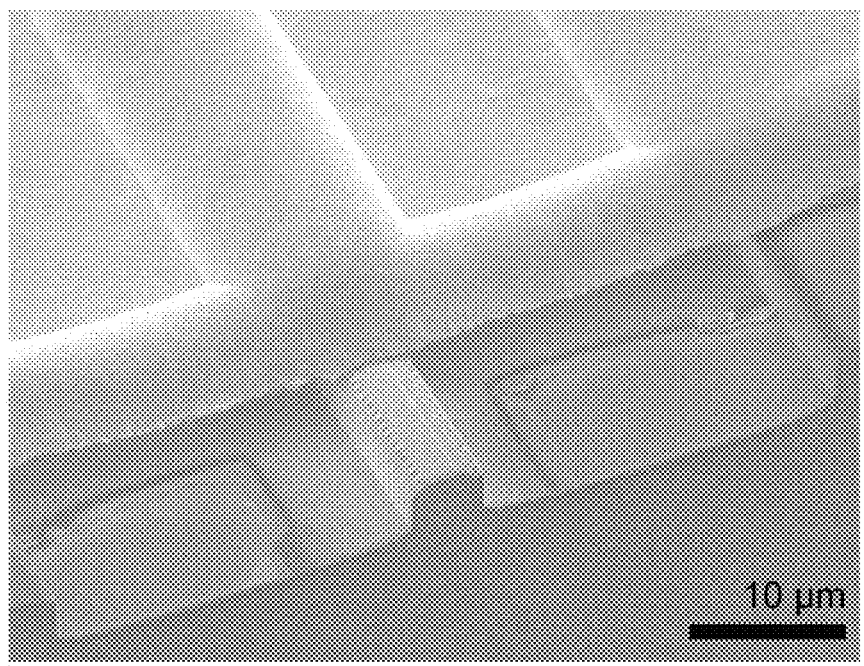
Figure 3C:
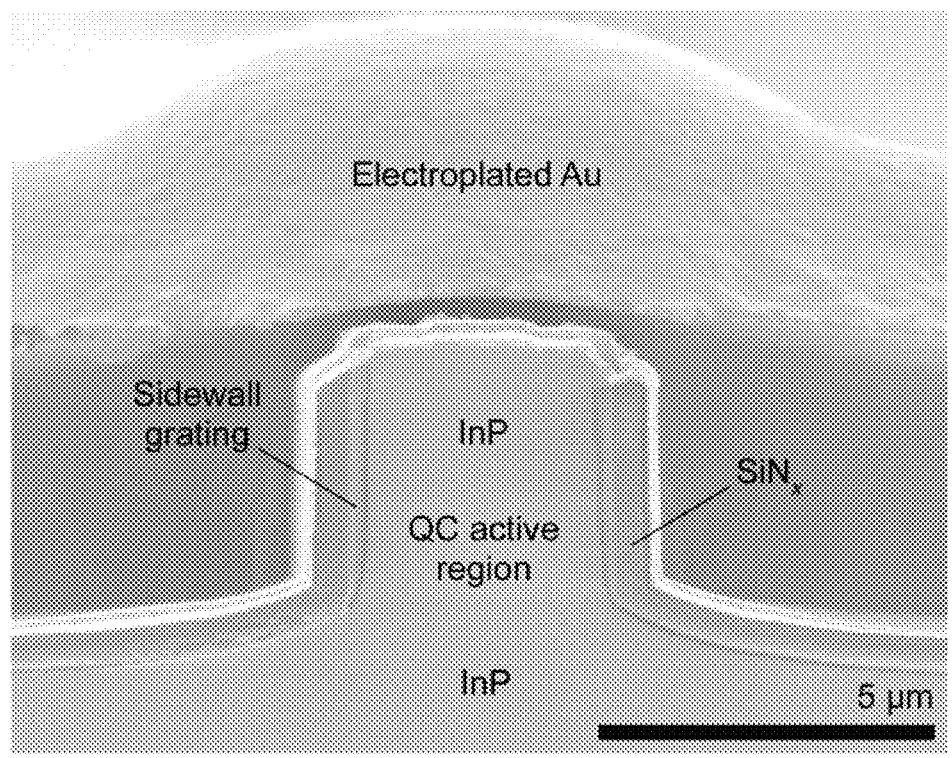

Following a brief wet etch in a dilute solution of $H_2O_2$ and HBr to remove damaged material from the sidewall surfaces exposed during plasma etching, the ridges were conformally coated with 500 nm of $SiN_x$ using plasma enhanced chemical vapor deposition. After removing a narrow strip of $SiN_x$ from the top of the ridges by reactive-ion etching, broad Ti/Pt/Au top contacts were deposited, followed by electroplating of Au to a thickness of 5 μm, as shown in FIG. 3b. Finally, the wafer was thinned to ~100 μm, and an ohmic n-type back contact was deposited, and the wafer cleaved into 1-mm bars. A cross section of the final laser structure is shown in FIG. 3c.

Figure 4A:
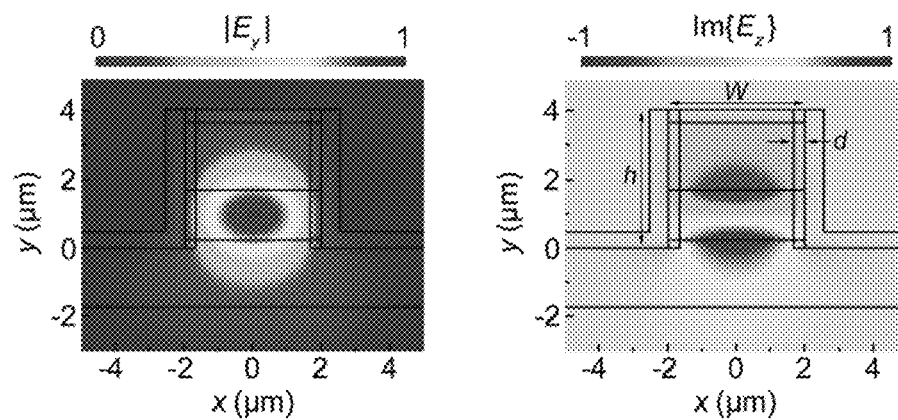
FIGS. 4a and 4b provide: a) a calculated electric field profile of the fundamental transverse magnetic mode supported by the DFB QC laser structure at 4.8 µm wavelength, including the magnitude of the dominant transverse component, $E_y$, and the imaginary longitudinal component, $E_z$, and (b) a calculated DFB grating coupling coefficient, κ, based on the geometry shown in the inset as a function of modulation depth, d, with W=h=4 µm, in accordance with embodiments of the invention.
Figure 4B:
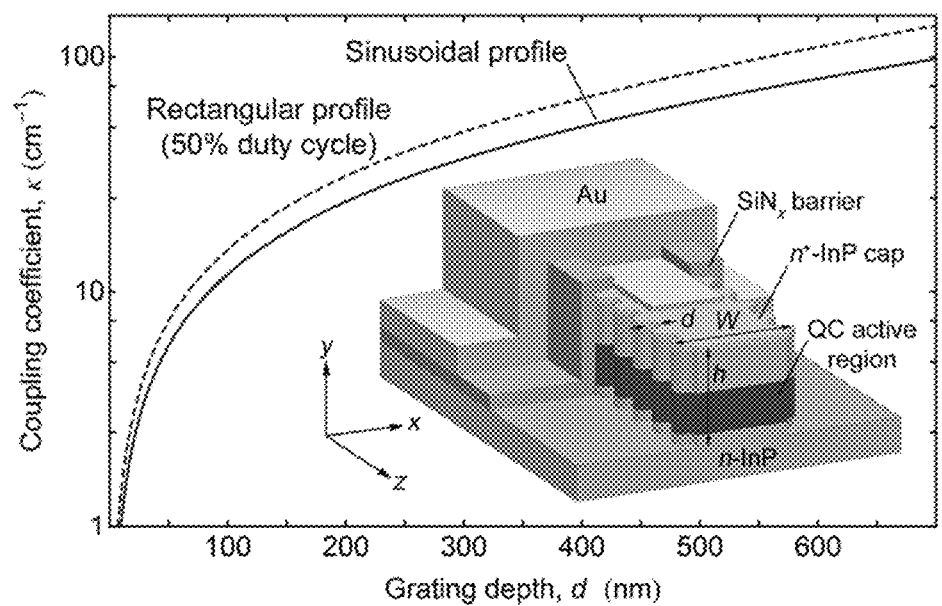

A schematic of the laser ridge geometry is shown in FIGS. 4a and 4b, along with calculations of the optical mode profile and coupling coefficient, κ, for first-order DFB sidewall gratings of varying modulation depth, d. As described above, the sidewall gratings and the low-index dielectric cladding in accordance with embodiments both contribute to strong lateral mode confinement compared with InP-clad buried heterostructure lasers, which enables a narrow ridge geometry without excessive absorption loss from the Au contact. With a ridge width of W=4 μm, the absorption loss from the Au was calculated to be 0.14 $cm^{-1}$.

In addition, calculations show that large values of κ can be achieved with a relatively shallow grating depth, which enables strong DFB coupling for short cavity lengths. In the calculation of κ, it should be noted that emission from intersubband transitions in the QC active region couples into the fundamental transverse-magnetic mode supported by the laser ridge; however, relative to the location and orientation of the sidewall gratings, the mode exhibits dominant transverse-electric character with near-zero imaginary electric field in the longitudinal direction, as shown in FIG. 4a. Consequently, for the geometry represented in the inset of FIG. 4b, it is possible to employ the following coupled-mode theory approximation to estimate κ assuming a first-order sinusoidal grating profile:

$$\kappa = \frac{4}{n_{eff}\lambda d} \left[ \frac{\int_0^h \int_{\frac{w}{2}-d}^{w/2} (n_{ridge}(y) - n_{dielectric}^2)}{\sqrt{\left(\frac{w}{2}-x\right)\left(x-\left(\frac{w}{2}-d\right)\right)}|E(x,y)|^2 dxdy} \right], \quad \text{(EQ. 1)}$$

where $\lambda$ is the free-space wavelength, h is the ridge height, $n_{dielectric}$ is the refractive index of the dielectric cladding, $n_{ridge}$ is the index of the semiconductor ridge in the grating region, and an additional factor of two is included to account for both sidewall gratings. Treating the grating region as an effective medium with a dielectric constant equal to the average of the semiconductor and dielectric cladding dielectric constants, the modal effective index, $n_{eff}$, and electric field, E, may be numerically calculated for the two-dimensional laser ridge cross section. As shown in FIG. 4b, $\kappa=31$ cm$^{-1}$ for the fabricated grating modulation depth of d=250 nm, corresponding to a moderately over-coupled structure with $\kappa L \approx 3$ for a cavity length of L=1 mm.

Figure 5:
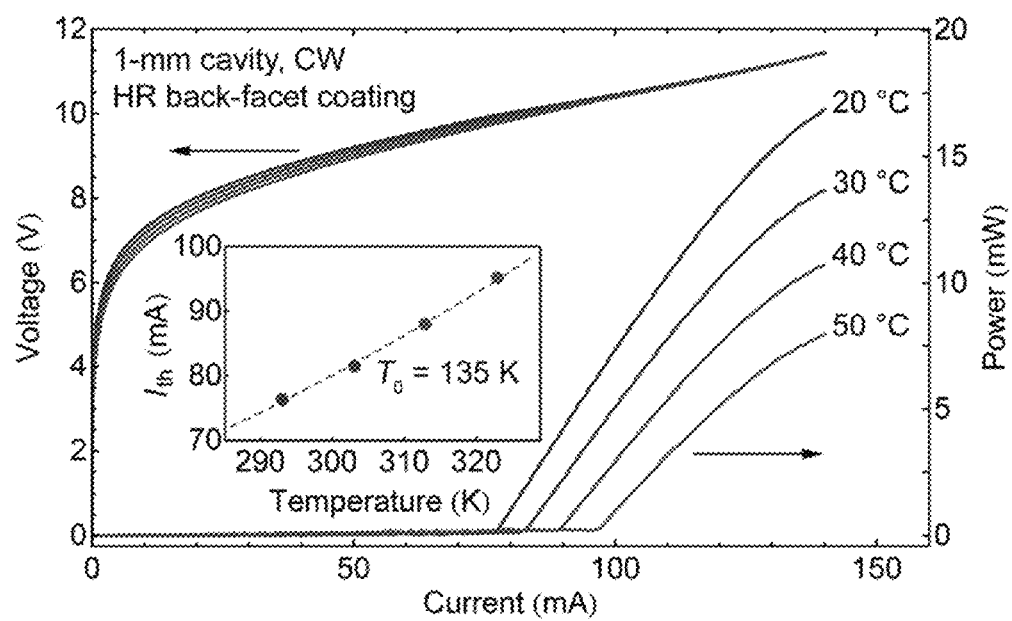
FIG. 5 provides a data graph showing CW light-current-voltage characteristics for a 1-mm-long device with an uncoated emission facet and HR-coated back facet as a function of submount temperature, and (inset) a data graph showing the increase in laser threshold current, mA, corresponds to a characteristic temperature of $T_0$=135 K, in accordance with embodiments of the invention.

To partially compensate for facet loss, high-reflectivity (HR) dielectric coatings composed of an amorphous Si and Al$_2$O$_3$ multilayer stack were deposited onto the back laser facets by electron-beam evaporation. Reflection measurements collected using a Fourier transform infrared (FTIR) spectrometer indicate reflectivity of 80% at 4.8 μm for coatings deposited on reference substrates. The laser emission facet was left uncoated, and individual DFB QC lasers were mounted epitaxy-side-up on Au-coated Cu submounts using AuSn eutectic solder. Devices were tested on submounts as well as in TO-3 packages with integrated thermoelectric coolers and ZnSe optics. FIG. 5 shows current-voltage measurements and light output from a packaged laser with a DFB grating pitch of 775 nm. Threshold power consumption is below 1 W up to a heat-sink temperature of 50° C. At 20° C., the CW threshold current of the laser is $I_{th}=76.2$ mA, corresponding to a current density of 1.91 kA/cm$^2$ and power consumption of 757 mW. With 1 W of input power, the laser output exceeds 6 mW—which is suitable for many in situ spectroscopy applications.

Figure 6A:
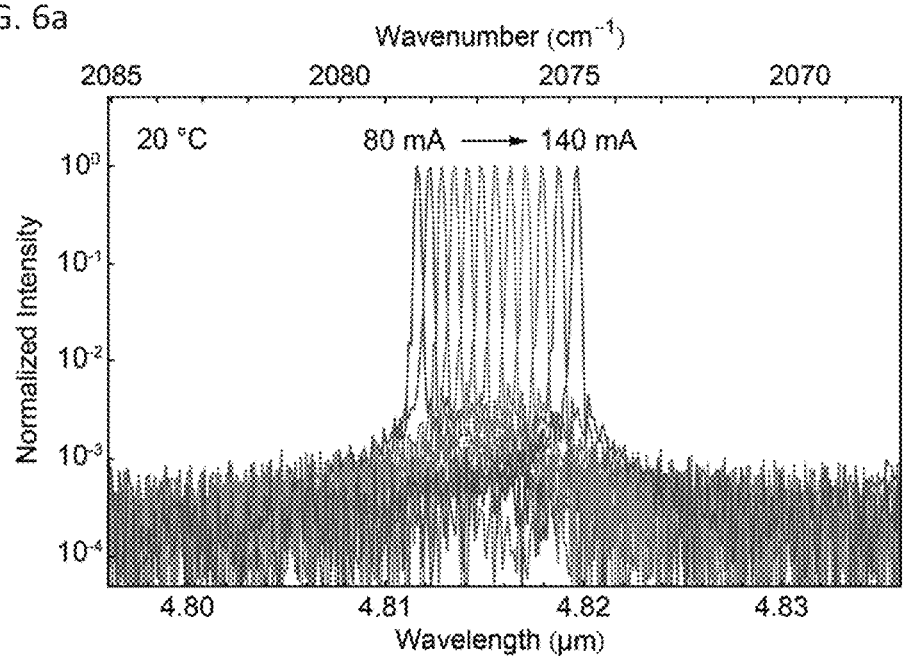
FIGS. 6a and 6b provides: a) a DFB QC laser CW emission spectra collected as a function of injection current in increments of 5 mA at 20° C., and b) a peak emission wavelength of the same device at various heat-sink temperatures in accordance with embodiments of the invention.
Figure 6B:
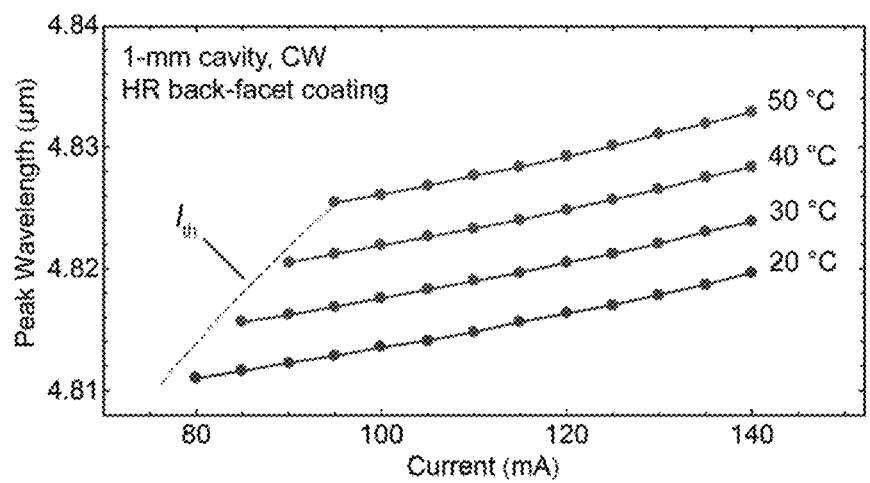

Emission spectra were collected from the device using an FTIR spectrometer and are plotted in FIGS. 6a and 6b over a range of injection currents. For submount temperatures at and above room temperature, stable single-mode emission was observed with mode-hop-free tuning over the entire current range of the laser. Although the DFB lasers in accordance with the exemplary embodiments have uniform index-coupled gratings that, in the case of symmetric facet reflectivity, would lead to two symmetric DFB modes separated by a mode gap, only stable single-mode emission was observed for a majority of the lasers tested. This stability is attributed to strong grating coupling as well as asymmetric loss in the longitudinal DFB modes resulting from the dissimilar reflectivity between the two laser facets. (See, e.g, discussion in W. Streifer, et al., *IEEE J. Quantum Electron.* 11, 154-161 (1975), and M. Briggs, et al., Opt. Express 21, 1317-1323 (2013), the disclosures of which are incorporated herein by reference.) As shown in FIG. 6a, no evidence of additional side modes appears within 30 dB of the peak emission intensity, which is limited by the noise level in the FTIR measurements.

Figure 7:
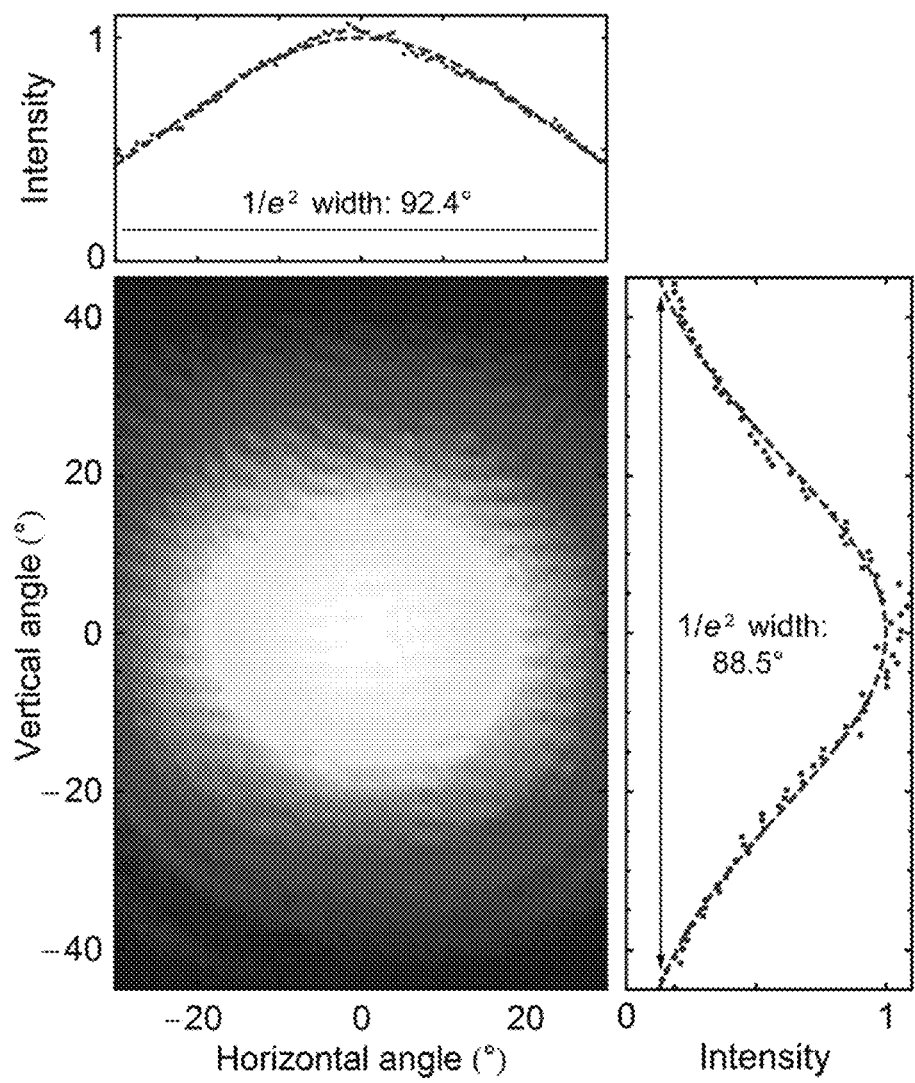
FIG. 7 provides a measured two-dimensional far-field emission profile of a DFB QC laser in accordance with embodiments of the invention, in the inset data plots vertical and horizontal cross sections of the far-field intensity are each shown with a Gaussian fit.

For typical mid-infrared QC laser designs where the thickness of the active region is significantly smaller than the ridge width, InP-clad buried heterostructure devices produce a far-field profile with a larger divergence angle in the vertical direction compared with the horizontal direction. As shown in FIG. 7, the narrow ridge geometry realized here produces a nearly symmetric far-field emission profile as a result of the high-index-contrast dielectric sidewall cladding. An unpackaged laser using a cooled HgCdTe detector was characterized on a two-axis goniometer and a full-width 1/e$^2$ divergence angle of 92.4° and 88.5°, respectively, was measured in the horizontal and vertical directions relative to the laser ridge. While these divergence angles correspond to a relatively large numerical aperture, the symmetry of the horizontal and vertical divergence enables efficient coupling to radially symmetric focusing and collimating optics. Finally, after a slight increase in output power at fixed injection current during the first 100 h of operation, an unpackaged DFB QC laser was operated at room temperature for more than 2500 h without measurable degradation in output power or spectral stability.

The tests of this exemplary embodiment demonstrates that single-mode QC lasers capable of operation up to 50° C. with power consumption below 1 W and output power sufficient for many in situ laser spectrometer applications may be formed. In addition, the embodiments of the fabrication process for the DFB QC lasers involves no epitaxial regrowth processes, which eliminates requirements for specialized deposition tools after the initial semiconductor growth. Compared with previously demonstrated CW QC lasers, the low power dissipation of these devices is compatible with more compact laser packages and lower-capacity thermoelectric coolers, and the nearly symmetric far-field emission profile allows for efficient coupling to external optics. Ultimately, the CW QC sidewall lasers in accordance with embodiments enable the development of portable, low-power laser spectrometers operating at mid-infrared wavelengths for detection of compounds in atmospheric science, environmental monitoring, and other sensing applications.

Embodiments Incorporating In-Filed Grating Structures

Many other embodiments are direct to index-coupled DFB QC lasers with low-loss spin-on dielectric materials that enable high efficiency while maintaining lower-cost processing, and method of manufacturing such lasers. Embodiments of continuous-wave (CW) operation of QC lasers are provided that operate at room temperature using a single wafer growth step followed by etched grating fabrication with a polymer infilling (such as, a polyimide).

For several years, QC lasers have proven useful for targeting strong fundamental molecular absorption lines in the mid-infrared region of the electromagnetic spectrum, at wavelengths inaccessible using conventional diode laser technology. As mentioned previously, for single-mode operation with stable and continuous tunability, DFB lasers with integrated gratings for wavelength filtering are the most compact and robust devices available (alternatively, an external cavity with separate gratings and reflectors can be used, leading to a considerable increase in system size and susceptibility to misalignment). DFB QC lasers have also been demonstrated with metallic gratings, which introduce optical loss and negatively impact laser performance. Alternatively, gratings etched directly into the QC laser semiconductor structures have been demonstrated, but require high-quality epitaxial regrowth in order to maintain electrical access to the QC active region. Embodiments of DFB QC laser geometries presented here avoid optical losses by making use of etched index-coupled gratings infilled with non-absorbing polymer, and electrical access is maintained since the gratings do not span the full width of the laser ridge. The embodiments demonstrate acceptable room-temperature CW laser operation, while using a low-cost polymer planarization process.

Figure 8A:
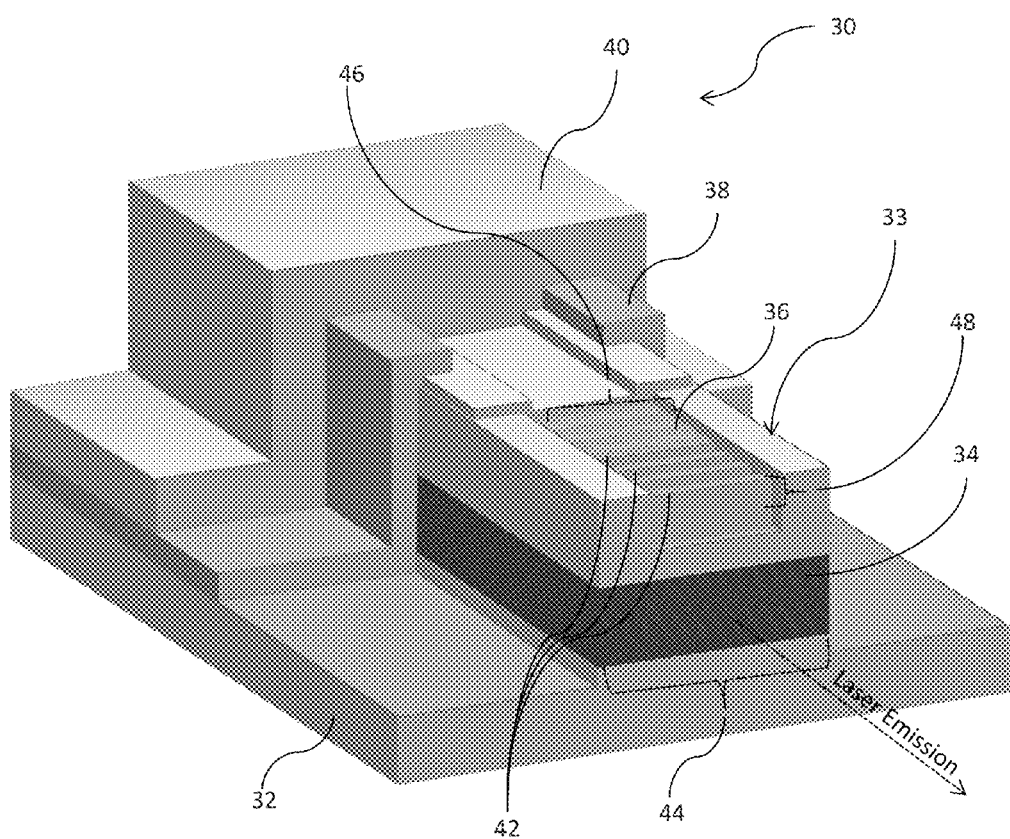
FIG. 8a provides a schematic of a DFB-QCL with an etched surface grating within polymeric infilling in accordance with embodiments of the invention.

As shown schematically in FIG. 8a, in many embodiments the top-grating QC lasers (30) comprise a multilayer structure formed atop a suitable semiconductor substrate (32). In an exemplary embodiment the substrate is formed from an InP layer, however any suitable substrate material may be used, including GaAs and GaSb. A waveguide ridge (33) having an active region (34) with a quantum well structure is fabricated from epitaxial wafers disposed atop the substrate. In one exemplary embodiment the active region was formed with a two-phonon extraction structure from InGaAs/AlInAs epitaxial lasers, although other alloys matched to InP, GaAs, or GaSb may be selected, and the unique aspects of the lasers could be applied to other optimized active region designs at various wavelengths based on the desired laser performance.

Atop this waveguide ridge structure a dielectric barrier (38) and conductive contact (40) are disposed to complete the structure. In many embodiments, the dielectric cladding layer is formed of a material at a thickness sufficient to isolate the optical mode guided by the laser waveguides from the top electrical contacts, while being simultaneously thin enough to allow for some thermal extraction through the cladding to the conductive contact. With respect to the dielectric barrier and contact layers it will be understood that any suitable materials, such as may be known in the prior art may be used to form these structures. For example, in many embodiments the dielectric layer may be made from aluminum nitride (AlN) or silicon nitride ($SiN_x$). In some embodiments the dielectric layer has a thickness of less than 1 µm. Likewise, the conductive contacts may be made from any suitable conductive material, such as, for example, a conductive metal such as Au, Ag, Pt, Pd, Cu, etc. Preferably the contact layer is sufficiently thick to serve as a heat sink to the laser. In some such embodiments a contact layer comprising a conductive metal of at least 5 µm is used.

Turning to the construction of the waveguide ridge (33) of the QC lasers, in accordance with many embodiments the ridge is formed with a uniform ridge width (44) through the entire laser active region (34). Although suitable ridge widths may vary, in many embodiments the width of the waveguide ridge is constrained such that the ridge supports only one lateral optical mode of a polarization matched to the polarization of light emitted in the active region. In many embodiments a waveguide ridge width narrower than the free-space wavelength of the laser emission may be used. In some embodiments a waveguide ridge width of around 5 µm may be used. Constraining the width of the waveguide ridge in accordance with embodiments allows for a relatively small absolute current to be sourced through the laser while achieving the relatively large current densities required to reach laser threshold, which ultimately reduces both power consumption and heat generation.

Figure 9A:
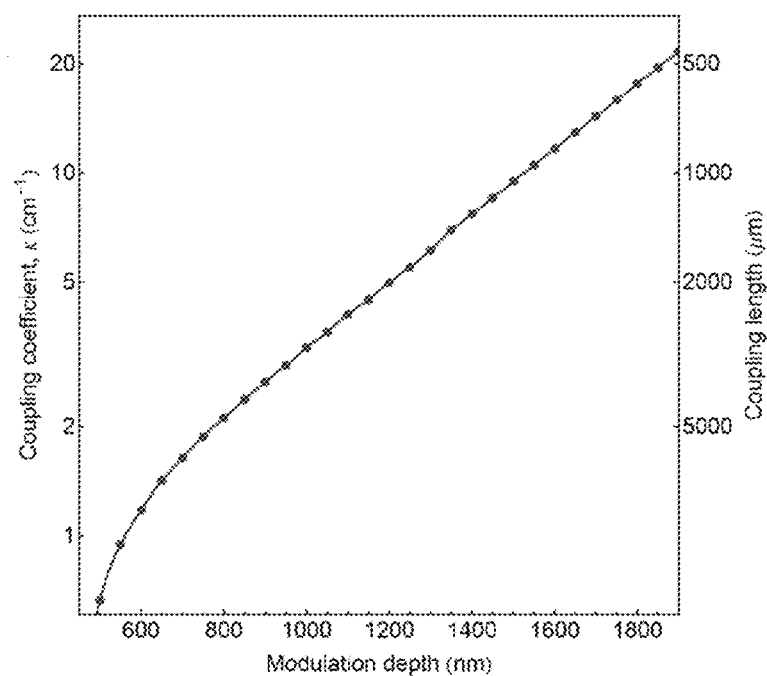
FIG. 9a provides a data plot of a calculation of the grating coupling coefficient, κ, as a function of grating depth in accordance with embodiments of the invention.
Figure 9B:
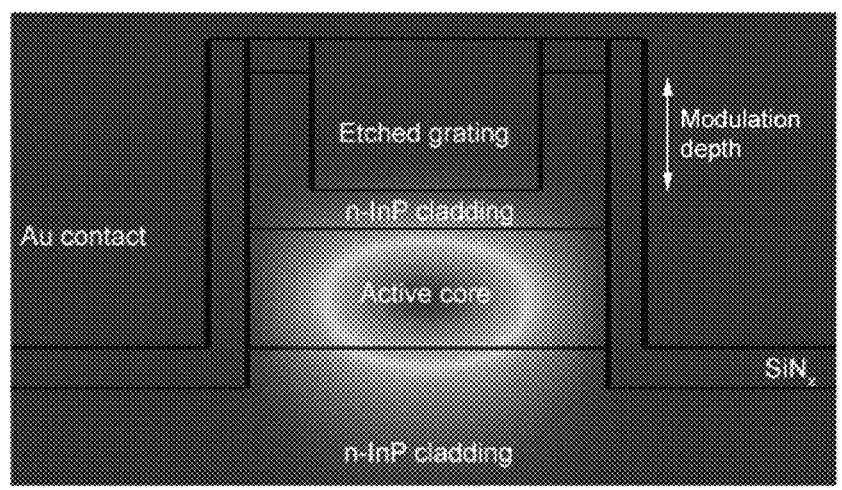
FIG. 9b provides a plot of the electric-field intensity of the optical mode supported by the laser geometry shown superimposed on the laser cross-section in accordance with embodiments of the invention.

In many embodiments a grating (42) is formed along the longitudinal length of the top surface of the waveguide ridge (33) that imposes single-mode laser operation on the laser. The grating is formed by a plurality of grating ridges (42) formed to run laterally across at least a portion of the width (44) of the waveguide ridge (33) to define a grating width (46). The profile of the sidewall grating will depend on the interaction strength required to impose single-mode operation on the active region of the laser. In many embodiments, the grating is defined by a modulation depth (i.e., the vertical depth (48) that the grating corrugation cuts into the top of the waveguide ridge), and the period and shape of the grating openings can be precisely patterned to provide optimal grating interaction strength for a given ridge width and cavity length (i.e., longitudinal length of the waveguide ridge). In some embodiments, a top grating may be designed having a modulation depth that is d, that is greater than the pitch, $\Lambda$, of the periodic corrugations (i.e. the aspect ratio, $d/\Lambda$ is greater than 1). In many embodiments, a suitable design of top grating (e.g., modulation depth and tooth profile) may be selected by determining the optical mode profile of the active region and a suitable coupling coefficient, $\kappa$. In some such embodiments the coupling coefficient may be calculated using a suitable coupled-mode theory approximation for transverse-magnetic polarized guided modes, such as is described, for example, in W. Streifer, et al., *IEEE J. Quantum Electron*. 12, 74-78 (1976), the disclosure of which is incorporated herein by reference. (An exemplary embodiment of such a calculation is shown in FIGS. 9a and 9b.) Overall, by forming a waveguide ridge with DFB top gratings in accordance with embodiments a laser having excellent current densities, power consumption and heat generation may be obtained.

Finally, in many embodiments the top grating (42) is planarized to the level of the top surface of the waveguide ridge by an infilled polymeric infill layer (36). Although any suitable polymeric material may be used in association with the infill layer, in some embodiments a polyimide layer is used.

Embodiments are also directed to methods of forming QC lasers with a plasma-etching step for etching the surface gratings partially into the top epitaxial cladding layer and a second plasma-etching step for defining the laser ridge through the light-emitting active region. Such QC laser fabrication processes are greatly simplified compared with the two regrowth steps previously required to obtain lasers with similar performance. The process is also compatible with grating pitch dimensions below 1 µm, enabling fabrication of first-order DFB gratings that can generate single-mode light emission at wavelengths below 5 µm without radiation loss into higher diffraction orders.

Figure 8B:
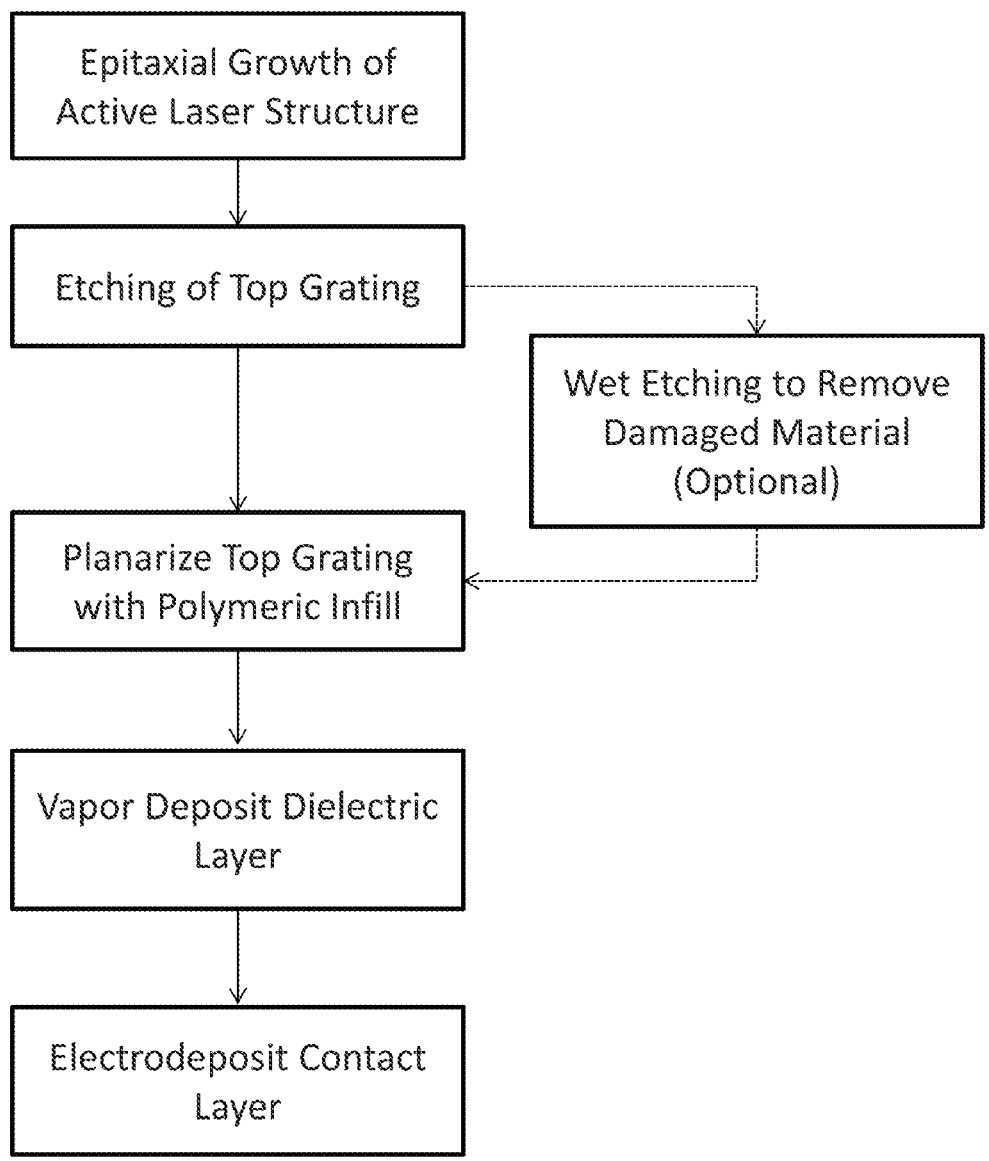
FIG. 8b provides a flow-chart for a process of forming a QC laser structure in accordance with embodiments of the invention.

In many embodiments a process for forming a QC laser is provided in a flow chart in FIG. 8b. Initially the waveguide ridge, including the active region and cladding are deposited on a suitable substrate via epitaxial growth. It should be understood with respect to the formation of the epitaxial layers that any suitable technique may be used such as, for example, molecular beam epitaxy, which provides precise thickness control, sharp layer interfaces, and controlled doping, or alternative processes, such as, for example, metal-organic chemical vapor deposition.

Once the epitaxial layers of the waveguide ridge and active region are disposed atop the surface an anisotropic plasma etching process is used to etch the pattern of the top grating through the top layer of the waveguide ridge. Specifically, gratings are etched into the QC upper cladding layer using a chlorine/hydrogen/methane plasma etching process. As opposed to the isotropic wet chemical processes typically used to fabricate waveguide ridges for QC lasers, the plasma etching process allows for precise patterning of small features on the top surface of the wafer using standard lithography processes, and then for high-fidelity transfer of those features to the epitaxial waveguide ridge. Optionally, the plasma etching process may be followed by a brief wet etch to remove debris and damaged material from the etched surface, however, the wet etch process should be controlled such that the device geometry is not substantially modified.

Once the DFB top grating is formed, the grating is planarized via infilling with a material with a lower refractive index than the epitaxial cladding layer. Although any suitable high-refractive-index-contrast infill may be used, infilling the high-aspect-ratio grating openings with polyimide is used in some embodiments. (In an exemplary embodiment, the InP cladding has a refractive index of approximately 3.1 near 5 µm, while polyimide has an index of nearly 1.7 resulting a refractive-index difference of 1.4.)

For electrical isolation of the etched laser ridges, a dielectric layer (such as, for example, aluminum nitride (AlN) or silicon nitride ($SiN_x$)) is deposited atop the waveguide ridge using plasma-enhanced chemical vapor deposition or another non-epitaxial deposition process. Preferably the dielectric layers are transparent at the laser emission wavelength and are made sufficiently thick to isolate the optical mode guided by the laser waveguides from the top electrical contacts, but simultaneously thin enough to allow for lateral thermal extraction. Finally, a thick (2 to 10 µm, but typically 5 µm) electroplated contact layer (such as of Au) is deposited atop the dielectric layer to further help dissipate heat generated in the QC active region.

Figure 10A:
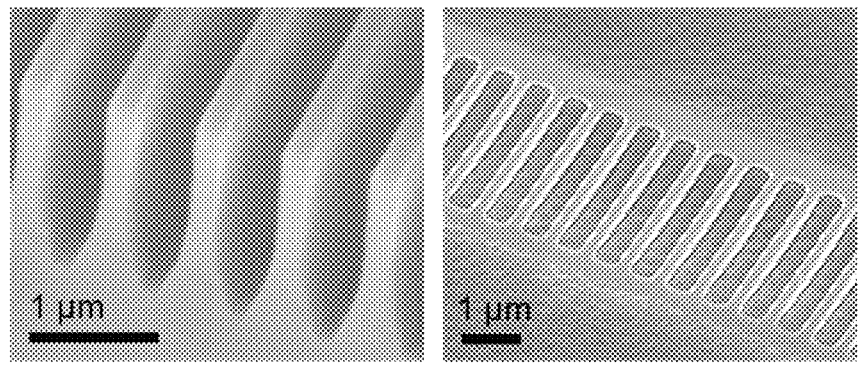
FIG. 10a provides scanning electron micrographs of fabricated DFB-QCL devices, showing a high-aspect-ratio etched top surface grating structure, a grating after polyimide infill and planarization etching.

In one exemplary embodiment, a strain-balanced QC laser structure (based on a conventional active region, such as is described in A. Kosterev, et al., *Appl. Phys. B* 90, 165-176 (2008), the disclosure of which is incorporated herein by reference) was grown on InP substrates using molecular beam epitaxy. A total of 30 periods of a 50.4-nm-thick doubly resonant injector/active region were grown, resulting in an overall thickness of slightly more than 1.5 µm. Lightly doped ($2\times10^{16}$ cm$^{-3}$) 2-µm-thick InP cladding layers were grown below and above the active region to minimize absorption loss from the substrate and top contact layers. First-order diffraction gratings were patterned by electron-beam lithography with a lateral width of 3 µm, and the gratings were etched in an anisotropic chlorine/hydrogen/methane inductively coupled plasma (ICP) process to a depth of nearly 2 µm, as shown in the SEM of FIG. 10a. The etched gratings were then coated with a spin-on polyimide precursor and cured at 350° C. The polyimide was etched back to the top of the gratings using tetrafluoromethane/oxygen reactive-ion etching, and titanium/platinum/gold ridge contacts were deposited over the grating regions.

Figure 10B:
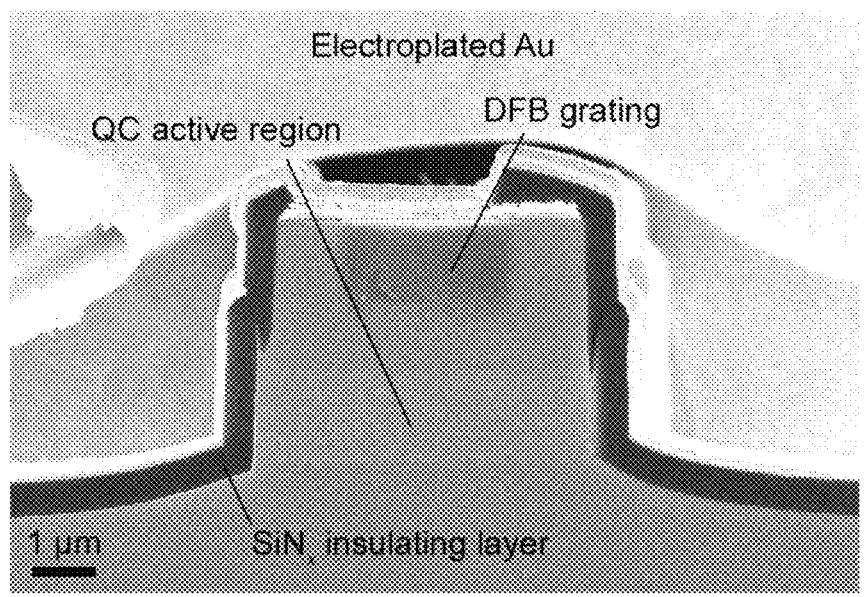
FIG. 10b provides an electron-micrograph cross section of a completed DFB-QCL device with a high-aspect-ratio etched top surface grating structure in accordance with embodiments of the invention.

Additional lithography and ICP etching processes were used to define 5-µm-wide ridges, with the gratings centered between the ridge sidewalls. The ridges were coated with silicon nitride using plasma-enhanced chemical vapor deposition, and the silicon nitride was stripped away from the ridge contacts. Finally, 10-µm-thick Au contacts were electroplated over the ridges, and individual lasers were cleaved into 1- and 2-mm-long bars (longitudinal cavity length). (An SEM of a cross-section of the laser is shown in FIG. 10b.) For testing, individual lasers were attached epitaxy-side up to gold-coated copper submounts using gold-tin eutectic solder.

Figure 11A:
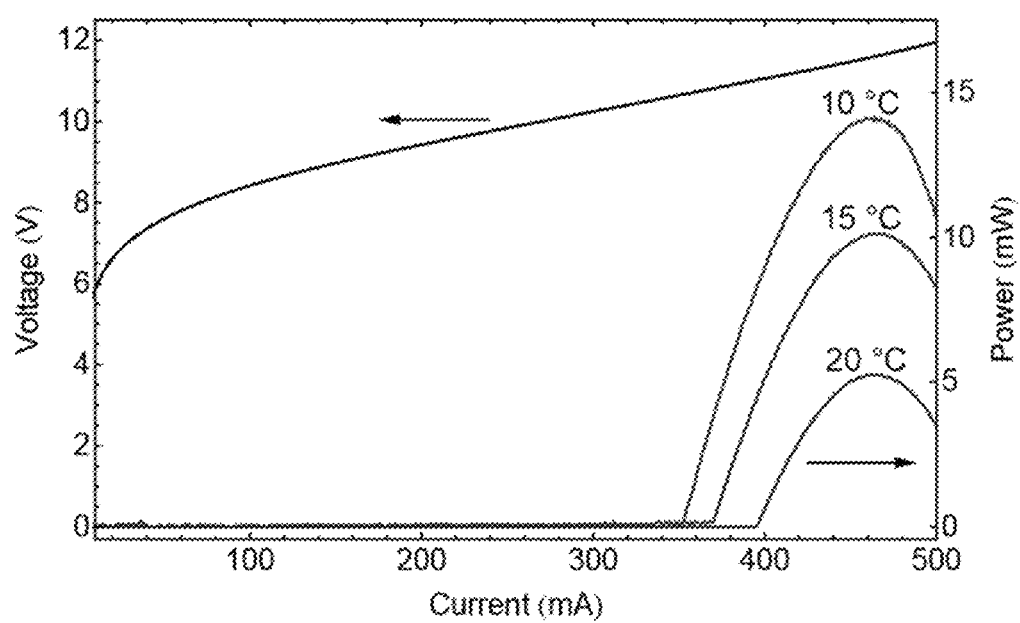
FIG. 11a provides a plot of the CW light-current-voltage performance of a 2-mm-long DFB QC laser with uncoated facets in accordance with embodiments of the invention.

FIG. 9a provides a calculation of the grating coupling coefficient, κ, as a function of grating depth. The electric-field intensity of the optical mode supported by the laser geometry is also shown superimposed on the laser cross-section in FIG. 9b. The grating modulation depth is defined relative to the top of the upper InP cladding layer. The CW light output and current-voltage characteristics of a 2-mm-long DFB QC laser with a grating pitch of 760 nm indicate single-mode emission near 4.75 µm with a threshold current of approximately 400 mA near room temperature is shown in FIG. 11a. The maximum output power corresponds to an injection current density of 4.6 kA/cm² with input power of 5.3 W. The laser emission wavelength can be tuned continuously by varying heat-sink temperature or injection current.

Figure 11B:
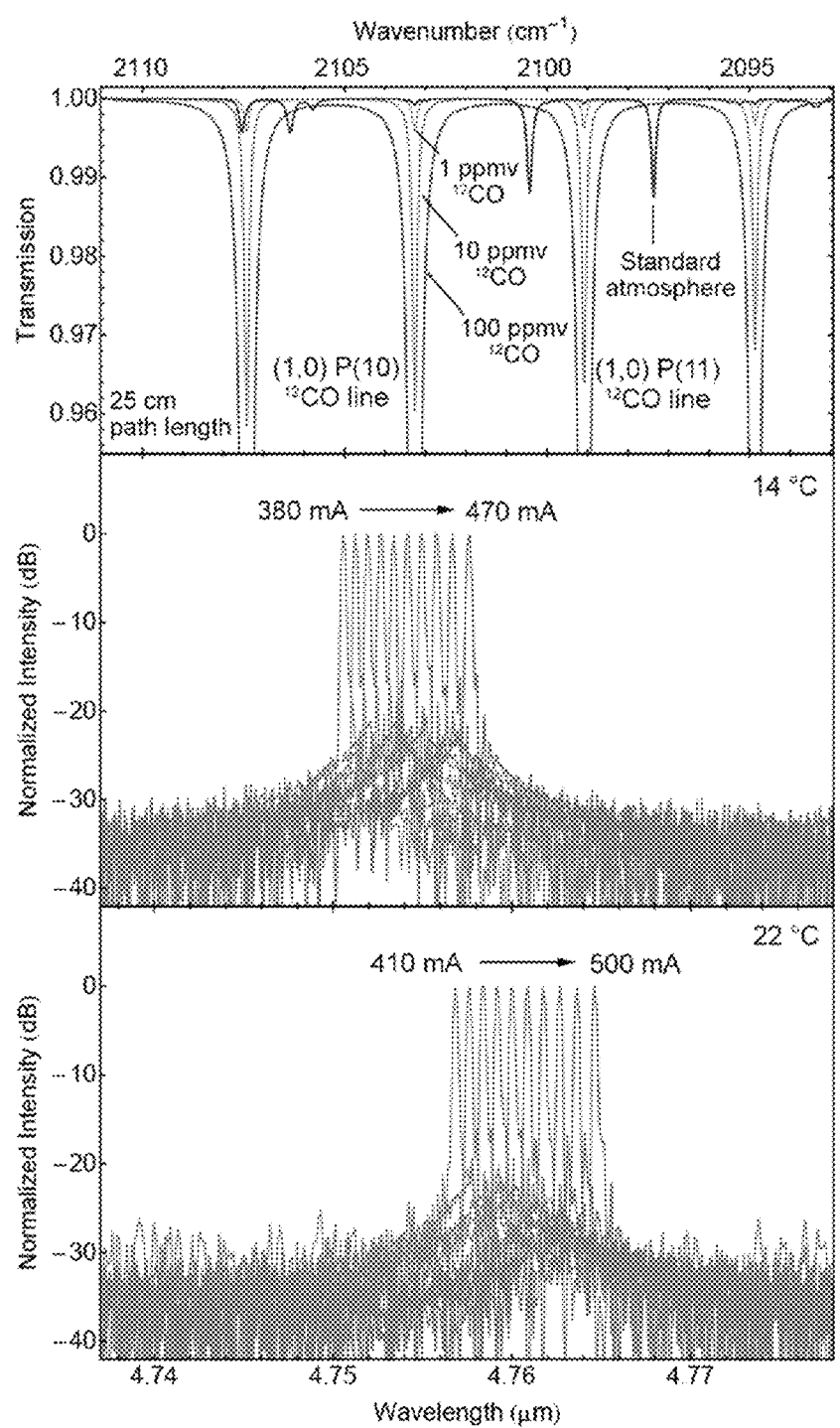
FIG. 11b provides laser emission spectra in accordance with embodiments of the invention.

Finally, FIG. 11b provides laser emission spectra at two different heat-sink temperatures shown over a range of injection current, in increments of 10 mA using the laser in accordance with embodiments. For reference, the top panel indicates the position of CO absorption lines near 4.75 µm for several concentrations.

Embodiments Overview

Embodiments have provide single-mode distributed-feedback quantum cascade lasers emitting continuous-wave threshold power consumption (e.g., in some embodiments at 4.8 µm with consumption as low as 0.76 W at 20° C. and 0.98 W at 50° C., among others). In addition, embodiments of methods of forming such lasers where following growth of the laser active region and semiconductor cladding layers by a single molecular beam epitaxy process, devices with narrow, single-mode ridges (e.g., 4-µm-wide in some embodiments, among others) and vertical sidewall gratings may be fabricated using plasma etching and standard dielectric and metal deposition processes. In terms of mode stability, output power, and efficiency, embodiments show that lasers fabricated based on these designs (e.g., with 1-mm cavity length and high-reflectivity back-facet coatings in some embodiments among others) can match the performance of buried heterostructure devices, but with the advantage of requiring only a single epitaxial growth step.

Embodiments also use a regrowth-free fabrication process to demonstrate single-mode QC lasers with low power consumption. By employing etched index-coupled sidewall gratings with dielectric cladding and in-filled top gratings, embodiments avoid losses associated with conventional metal surface grating designs. The lasers described in embodiments have sufficiently low power dissipation that they have been successfully packaged in compact enclosures with low-capacity thermoelectric coolers and integrated collimating optics for in situ environmental monitoring and planetary science instruments.

Over the past three decades, JPL and NASA have flown laser spectrometers to characterize atmospheric processes for a variety of Earth and planetary missions. Among many other studies, tunable laser spectrometers were deployed for the BLISS balloon studies to study trace gases in Earth's stratosphere, for the Mars Volatile and Climate Surveyor instrument on the Mars Polar Lander (Mars 98), and for the New Millennium Deep Space 2 to measure humidity near the surface of Mars. More recently, the TLS on the Curiosity rover Sample Analysis at Mars Instrument Suite has provided the most comprehensive in situ measurements to date of H, C, and O isotope ratios. Following the success of the mid-infrared TLS aboard the Mars Science Laboratory Curiosity rover, in situ laser spectrometers are likely to play a vital role in future Earth and planetary science missions, including Venus In Situ Explorer and Saturn Probe. In order to include channels based on QC lasers to detect gases such as CO, OCS, $SO_2$, $PH_3$ and $NH_3$, NASA will require laser modules with power consumption well below that of commercial products that are currently available.

The QC lasers described according to embodiments can be used as sources in laser absorption spectrometers for precise measurements of ambient CO concentrations. Such instruments have applications for environmental monitoring aboard manned spacecraft, and particularly for early warning detection of combustion hazards and safety equipment malfunctions. By minimizing the cost and electrical power consumption of QC laser sources, portable laser absorption spectrometers can be produced for routine use on the International Space Station and future manned missions.

The DFB QC laser concept demonstrated according to embodiments can also be applied to lasers operating at a variety of infrared wavelengths. For example, single-frequency lasers at 10 µm can be used to monitor ammonia and hydrazine concentrations for both astronaut safety and troubleshooting of cooling and propulsion systems. Adapting the device design to other wavelengths simply requires a modified active region design and scaling of the grating and ridge dimensions.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A quantum cascade laser comprising:
   an elongated waveguide ridge having characteristic lateral dimensions comprising a height and a width, and a characteristic longitudinal dimension comprising a length, the waveguide ridge being formed of a plurality of epitaxial layers, the lateral and longitudinal dimensions of the waveguide ridge defining a laser cavity comprising an active region of semiconductor quantum well structures configured to employ intersubband electronic transitions;
   at least one conductive epitaxial cladding layer disposed atop and below the active region of the waveguide ridge;
   a distributed feedback grating comprising a plurality of periodic vertical corrugations formed into both lateral width edges of the waveguide ridge along the longitudinal length of said waveguide ridge, the corrugations having characteristic modulation depth and pitch;
   a dielectric layer conformally disposed atop the distributed feedback grating;
   a conductive contact layer disposed atop the dielectric layer and elongated waveguide ridge;
   wherein the corrugations are disposed through at least the top cladding layer and each of the epitaxial layers of the waveguide ridge; and
   wherein the lateral dimensions along the length of the waveguide ridge are comparable to or less than the wavelength of an emission confined therein to impose a single lateral spatial mode thereon; and
   wherein the modulation depth and pitch of the corrugations are configured such that the corrugations have a coupling coefficient sufficient to interact with the active region of the laser to impose a single spectral mode on an emission confined therein.

2. The quantum cascade laser of claim 1, wherein the corrugations have an open profile having a modulation depth, d, that is equal to or less than the pitch, Λ, of the periodic vertical corrugations such that the aspect ratio of the corrugations, d/Λ is less than 1.

3. The quantum cascade laser of claim 1, wherein the corrugations are configured such that no tangent of the corrugation surface is perpendicular to the longitudinal axis of the waveguide ridge.

4. The quantum cascade laser of claim 1, wherein the dielectric layer is formed of a material at a thickness sufficient to isolate the optical mode guided by the laser waveguide from the conductive contact layer;
   wherein the dielectric material is transparent at the laser emission wavelength; and
   wherein the dielectric material has a lower refractive index than the effective index of the laser active region thereby confining light to the laser ridge.

5. The quantum cascade laser of claim 1, wherein the dielectric layer is configured to allow for the conduction of thermal energy from the active region into the contact layer.

6. The quantum cascade laser of claim 1, wherein at least one of the top and bottom cladding layers are formed from InP, wherein the epitaxial layers of the waveguide ridge are formed from a combination of InGaAs and AlInAs, wherein the dielectric layer is formed of an AlN and/or $SiN_x$ material having a thickness of less than 1 µm, and wherein the conductive contact layer is formed from metal having a thickness of at least 2 µm.

7. A quantum cascade laser comprising:
   an elongated waveguide ridge having characteristic width and length dimensions and being formed of a plurality of epitaxial layers, the longitudinal length of the waveguide ridge defining a laser cavity comprising an active region of semiconductor quantum well structures configured to employ intersubband electronic transitions;
   at least one epitaxial cladding layer disposed below and atop the active region of the waveguide ridge;
   a distributed feedback grating comprising a plurality of corrugations formed into the top cladding layer across a portion of the width of the waveguide ridge along the longitudinal length of said waveguide ridge, the corrugations having characteristic modulation depth and profile;
   a polymeric planarization infill layer disposed atop the distributed feedback grating to form a smooth top surface;
   a dielectric layer disposed on the sidewalls of the waveguide ridge; and
   a conductive contact layer disposed atop the dielectric layer and elongated waveguide ridge;
   wherein the width is configured such that the waveguide ridge supports a single lateral spatial mode; and
   wherein the modulation depth and profile of the corrugations are configured such that the corrugations have a coupling coefficient sufficient to interact with the active region of the laser to impose single-mode operation and emission at specific engineered wavelengths thereon.

8. The quantum cascade laser of claim 7, wherein the dielectric layer is formed of a material at a thickness sufficient to isolate the optical mode guided by the laser waveguides from the contact layer.

9. The quantum cascade laser of claim 7, wherein the dielectric layer is formed to allow for the conduction of thermal energy from the active region into the contact layer.

10. The quantum cascade laser of claim 7, wherein the polymeric planarization infill layer comprises a polymer with a refractive index less than the epitaxial top cladding layer.

11. The quantum cascade laser of claim 7, wherein at least one of the top and bottom cladding layers are formed from InP, wherein the epitaxial layers of the waveguide ridge are formed from a combination of InGaAs and AlInAs, wherein the dielectric layer is formed of an AlN and/or $SiN_x$ material having a thickness of less than 1 µm, and wherein the conductive contact layer is formed from metal having a thickness of at least 2 µm.

\* \* \* \* \*